United States Patent [19]

Kaida

[11] Patent Number: 5,541,469
[45] Date of Patent: Jul. 30, 1996

[54] RESONATOR UTILIZING WIDTH EXPANSION MODE

[75] Inventor: Hiroaki Kaida, Nagaokakyo, Japan

[73] Assignee: Murata Manufacturing Co., Ltd., Japan

[21] Appl. No.: 227,279

[22] Filed: Apr. 13, 1994

[30] Foreign Application Priority Data

Apr. 14, 1993 [JP] Japan .................................. 5-087474
Oct. 21, 1993 [JP] Japan .................................. 5-263769

[51] Int. Cl.$^6$ .............................................. H01L 41/08
[52] U.S. Cl. ....................... 310/367; 310/348; 310/326; 310/346
[58] Field of Search .................................. 310/367, 368, 310/360, 361, 357, 358, 344, 348, 312, 323, 321, 346

[56] References Cited

U.S. PATENT DOCUMENTS

| | | | |
|---|---|---|---|
| 3,411,023 | 11/1968 | Quate et al. .............................. | 310/323 |
| 4,350,918 | 9/1982 | Sato ........................................ | 310/367 |
| 4,900,971 | 2/1990 | Kawashima .......................... | 310/367 X |
| 5,001,383 | 3/1991 | Kawashima .............................. | 310/367 |
| 5,059,853 | 10/1991 | Kawashima .............................. | 310/367 |
| 5,107,164 | 4/1992 | Kimura .................................... | 310/367 |
| 5,442,251 | 8/1995 | Kaida et al. ............................. | 310/321 |

FOREIGN PATENT DOCUMENTS

| | | | |
|---|---|---|---|
| 0052621 | 4/1980 | Japan .................................. | 310/368 |
| 55-64414 | 5/1980 | Japan .................................. | 310/344 |
| 57-48818 | 3/1982 | Japan .................................. | 310/344 |
| 63-260311 | 10/1988 | Japan .................................. | 310/368 |
| 63-311810 | 12/1988 | Japan .................................. | 310/368 |
| 2-79511 | 3/1990 | Japan .................................. | 310/368 |

OTHER PUBLICATIONS

"Vibration Engineering" by Osamu Taniguchi, pp. 112–116, 1957, and English translation thereof.

Primary Examiner—Mark O. Budd
Attorney, Agent, or Firm—Ostrolenk, Faber, Gerb & Soffen, LLP

[57] ABSTRACT

A piezoelectric resonator (21) utilizing a width expansion mode, which is formed by coupling support parts (26, 27) to nodal points of a piezoelectric resonance part (22) utilizing a width expansion mode including a rectangular piezoelectric ceramic plate (23) and electrodes (24, 25) formed on both surfaces thereof, and coupling dynamic dampers (28, 29) on other ends of the support parts (26, 27) respectively.

19 Claims, 11 Drawing Sheets

RESONATOR UTILIZING WIDTH EXPANSION MODE

BACKGROUND OF THE INVENTION

1. Field of the Invention

The present invention relates to a resonator utilizing a width expansion mode of a rectangular plate type vibrator, and more particularly, it relates to an energy-trap resonator having a structure which can effectively trap width expansion mode vibration.

2. Description of the Background Art

There have been developed piezoelectric resonators and piezoelectric filters which are used in various frequency ranges. However, substantially no effective piezoelectric resonator has been put into practice to be effectively used in the frequency range of 1 to 2 MHz, although a resonator utilizing a contour shear vibration mode of a rectangular plate type piezoelectric member has been commercialized to be used in this frequency range.

As described above, there has been no piezoelectric resonator which is effective in the frequency range of 1 to 2 MHz in general, while the commercially available piezoelectric resonator utilizing a contour shear vibration mode must be held with spring terminals, due to the properties of its vibration mode. Consequently, the structure for holding the piezoelectric resonator is inevitably increased in size.

DESCRIPTION OF RELATED ART

In consideration of means for solving the aforementioned problem, the inventor has found that it is possible to obtain a piezoelectric resonator which can be suitably used in the aforementioned frequency range by utilizing a width expansion mode of a rectangular plate type vibrator. Such a piezoelectric resonator utilizing a width expansion mode, which is not yet known in the art, vibrates in a vibration state between width mode vibration and expansion mode vibration of a rectangular plate type vibrator, as shown in FIGS. 1A and 1B in a plan view and a front elevational view respectively.

Referring to FIGS. 1A and 1B, this piezoelectric resonator 1 has a resonance part 2 which resonates in vibration of a width expansion mode. The resonance part 2 comprises a piezoelectric ceramic plate 3 which is uniformly polarized along its thickness and electrodes 4 and 5 which are formed on both major surfaces thereof. In the width expansion mode, centers of the major surfaces and central portions of the shorter edges of the piezoelectric resonance part 2 define nodal points of vibration. Therefore, support parts 6 and 7 are coupled to the central portions of the shorter edges of the piezoelectric ceramic plate 3 respectively. These support parts 6 and 7 which are coupled to the nodal points of vibration hardly inhibit vibration of the aforementioned width expansion mode. On the other hand, connecting conductive parts 8a and 8b are formed on single major surfaces of the support parts 6 and 7, to be electrically connected to the electrodes 4 and 5 respectively. These connecting conductive parts 8a and 8b are electrically connected to terminal electrodes 11 and 12 provided on single major surfaces of holding parts 8 and 10 which are coupled to outer side edges of the support parts 6 and 7 respectively. In the piezoelectric resonator 1 shown in FIGS. 1A and 1B, the piezoelectric ceramic plate 3, the support parts 6 and 7 and the holding parts 9 and 10 are integrally formed with each other. In other words, a ceramic plate is machined to have the plane shape shown in FIG. 1A, thereby defining the piezoelectric ceramic plate 3, the support parts 6 and 7 and the holding parts 9 and 10.

When the aspect ratio of the piezoelectric ceramic plate 3 is selected in a proper range and an alternating electric field is applied across the terminal electrodes 11 and 12 in the aforementioned piezoelectric resonator 1 utilizing a width expansion mode, the piezoelectric resonance part 2 having a rectangular plane shape is strongly excited in the width expansion mode. It is predicted that the piezoelectric resonator 1 consequently has impedance-frequency characteristics shown in FIG. 2 and respective parts of the piezoelectric resonator 1 are displaced in distribution shown in FIG. 3 in analysis by a finite element method.

In actual manufacturing of the piezoelectric resonator 1, however, it is extremely difficult to form the piezoelectric resonance part 2 in a correct size and a correct shape.

As schematically shown in FIG. 4 in a plan view with omission of the electrodes, for example, each of shorter edges 3a and 3b of the piezoelectric ceramic plate 3 may deviate from a shape shown in a broken line by about dx=50 μm. Such deviation is easily caused when positions for grooving both sides of a rectangular ceramic plate for forming the support parts 6 and 7 are misregistered from each other on both sides of the support parts 6 and 7.

It has been recognized that finally obtained impedance-frequency characteristics of the piezoelectric resonator 1 are considerably irregularized as shown in FIG. 5 when the shorter edges 3a and 3b of the piezoelectric ceramic plate 3 deviate from desired shapes due to misregistration in grooving as described above. In other words, extremely large spurious vibration X may be caused in the vicinity of an antiresonance point $f_a$ of the width expansion mode.

According to a result of finite element analysis, it has been recognized that displacement of spurious vibration X is distributed as shown in FIG. 6 when the shorter edges 3a and 3b of the piezoelectric ceramic plate 3 deviate from the target shapes as described above. In other words, it has been understood that an unnecessary mode is caused in addition to the width expansion mode as shown in FIG. 6 due to the deviation of the shorter edges 3a and 3b of the piezoelectric ceramic plate 3 from the target shapes, to irregularize the impedance waveform.

In the piezoelectric resonator 1 utilizing a width expansion mode, therefore, it is impossible to attain excellent resonance and filter characteristics unless the piezoelectric ceramic plate 3 is formed extremely in high accuracy.

SUMMARY OF THE INVENTION

An object of the present invention is to provide a resonator utilizing a width expansion mode which can reliably suppress an unnecessary mode other than the width expansion mode with no requirement for extremely high accuracy in formation of a resonance part utilizing a width expansion mode, thereby attaining excellent oscillation and filter characteristics.

According to a wide aspect of the present invention, provided is a resonator utilizing a width expansion mode comprising a resonance mode utilizing a width expansion mode of a rectangular plate, a support part having an end which is connected to a nodal point of the resonance part, and a dynamic damper which is coupled to another end of the support part.

The dynamic damper is formed utilizing phenomenon of a dynamic damper, the detail of which is described in "Vibration Engineering" by Osamu Taniguchi, CORONA PUBLISHING CO., LTD, pp. 113 to 116, for example. This phenomenon of a dynamic damper can be briefed as such a phenomenon that vibration of a principal vibrator which must be prevented from vibration is suppressed by a subvibrator when the subvibrator is coupled to the principal vibrator and the natural frequency of the subvibrator is properly selected. The dynamic damper according to the present invention corresponds to the subvibrator in the phenomenon of a dynamic damper, and is adapted to suppress vibration which is transmitted from the piezoelectric resonance part through the support part on the basis of the phenomenon of a dynamic damper.

In the piezoelectric resonator according to the present invention, the aforementioned support part is coupled to the nodal point of vibration of the piezoelectric resonance part utilizing a width expansion mode of a rectangular piezoelectric plate. Namely, the support part is coupled to the nodal point having the minimum displacement, whereby leakage of vibration from the resonance part toward the support part is extremely reduced.

Due to provision of the aforementioned dynamic damper, further, it is possible to reliably prevent vibration of the width expansion mode from external leakage by a phenomenon of a dynamic damper, even if leakage of the vibration takes place.

When the resonance part deviates from a target shape due to a problem in working thereof, an unnecessary vibration mode may be caused to displace the support part, while the dynamic damper can also suppress such an unnecessary vibration mode. Since this unnecessary vibration mode is caused in the vicinity of a target vibration frequency of the width expansion mode, the dynamic damper absorbs not only the vibration in the width expansion mode of the target frequency but vibration in the aforementioned unnecessary mode. Therefore, both of the vibration in the width expansion mode leaking from the support part to the dynamic damper and the aforementioned unnecessary vibration are reliably suppressed.

Thus, it is possible to provide a piezoelectric resonance component which is an energy-trap piezoelectric resonator utilizing a width expansion mode having excellent resonance and filter characteristics, thereby obtaining a piezoelectric resonator suitably used in the frequency range of 1 to 2 MHz, which has been hard to implement in the prior art.

According to a specific aspect of the present invention, the aforementioned piezoelectric resonator utilizing a width expansion mode is integrated with a rectangular frame type support member having an opening. In other words, provided is an energy-trap piezoelectric resonator further comprising a rectangular frame type support member, so that the aforementioned piezoelectric resonator is arranged in an opening of this rectangular frame type support member while the piezoelectric resonator and the rectangular frame type support member are integrated with each other as a single member.

In such a structure that the rectangular frame type support member and the piezoelectric resonator are integrated with each other, a part forming the piezoelectric resonator is arranged in the rectangular frame type support member. Therefore, it is possible to easily form a chip-type piezoelectric resonance component by pasting case substrates to upper and lower portions of the integral member to enclose the piezoelectric resonator which is arranged in the rectangular frame type support member. According to the aforementioned structure, further, the piezoelectric resonator is integrated with the rectangular frame type support member as a single member. Therefore, the piezoelectric resonator which is enclosed with the rectangular frame type support member has no junctions on its sides. When a piezoelectric resonance component is formed by the aforementioned piezoelectric resonator, therefore, it is possible to effectively improve sealing performance.

According to another specific aspect of the present invention, provided is a chip-type piezoelectric resonance component employing the inventive resonator utilizing a width expansion mode, in which case substrates are stacked on upper and lower portions of the resonator utilizing a width expansion mode while ensuring spaces for allowing vibration. In such a chip-type piezoelectric resonance component, a spacer may be arranged on a side of the piezoelectric resonator for sealing its vibrating part against the exterior, or the piezoelectric resonator may be integrated with a rectangular frame type support member, as described above.

The structure of the aforementioned piezoelectric resonator which is integrated with a rectangular frame type support member can be obtained by a proper method. Namely, a rectangular plate member comprising a metal plate or a silicone crystal plate and a piezoelectric thin film formed thereon, or a rectangular piezoelectric ceramic plate can be worked by laser beam machining or etching, to obtain this structure. Thus, the structure of the aforementioned piezoelectric resonator which is integrated with the rectangular frame type support member can be obtained through a relatively simple manufacturing step.

Further, as the material for the piezoelectric resonance part there may be used materials other than the piezoelectric ceramics, for example, a piezoelectric single crystal such as quart, $LiTaO_3$ or $LiNbO_3$.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings, to clarify the present invention.

Figure 7A:
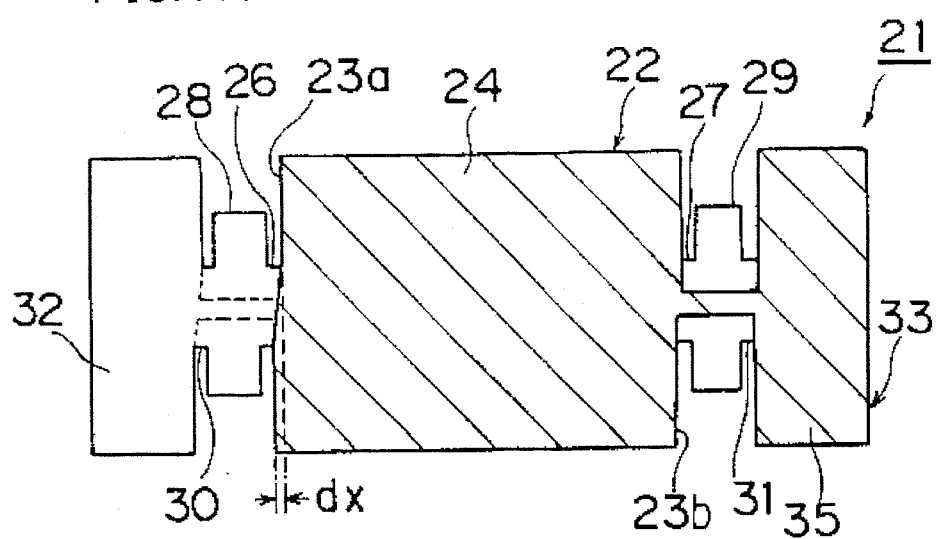
FIGS. 7A and 7B are a plan view and a front elevational view showing a piezoelectric resonator according to a first embodiment of the present invention.
Figure 7B:
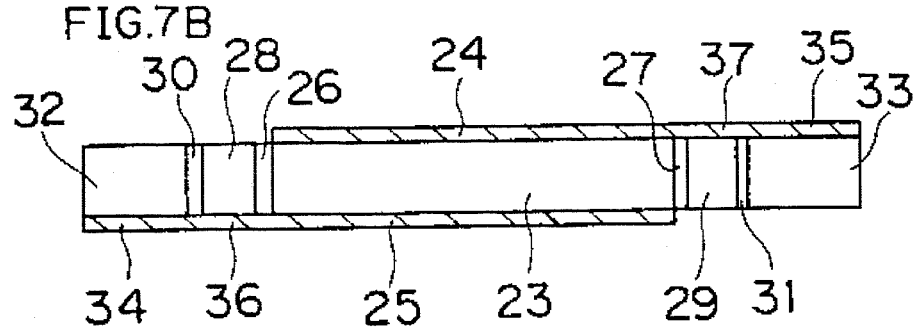

FIGS. 7A and 7B are a plan view and a front elevational view showing an energy-trap piezoelectric resonator 21 according to a first embodiment of the present invention respectively.

The piezoelectric resonator 21 has a substantially rectangular resonance part 22. The resonance part 22 comprises a piezoelectric ceramic plate 23 which is uniformly polarized along its thickness, and electrodes 24 and 25 which are formed on both major surfaces of the piezoelectric ceramic plate 23 respectively. An alternating voltage is applied across the electrodes 24 and 25 of the piezoelectric resonance part 22, to strongly excite vibration in a width expansion mode in the piezoelectric resonance part 22.

As hereinabove described, nodal points of the vibration in the width expansion mode are present in the center of the rectangular piezoelectric ceramic plate 23 and central portions of both shorter edges 23a and 23b thereof. According to this embodiment, therefore, support parts 28 and 27 are coupled to the central portions of the shorter edges 23a and 23b of the piezoelectric ceramic plate 23. Further, dynamic dampers 28 and 29 are coupled to other ends of the support parts 26 and 27 respectively. The dynamic dampers 28 and 29 are structured by providing vibrating parts in the form of longitudinal rods on the other ends of the support parts 26 and 27 in a direction which is perpendicular to that of extension of the support parts 26 and 27. These dynamic dampers 28 and 29 are made to have the same resonance frequency as that of vibration leaking through the support parts 26 and 27.

Single ends of coupling parts 30 and 31 are coupled to outer sides of the dynamic dampers 28 and 29, while holding parts 32 and 33 are coupled to outer ends of the coupling parts 30 and 31 for mechanically holding the piezoelectric resonator 21 according to this embodiment.

According to this embodiment, the support parts 26 and 27, the dynamic dampers 28 and 29, the coupling parts 30 and 31 and the holding parts 32 and 33 are integrally formed with each other. Namely, a piezoelectric ceramic plate is machined to have the plane shape shown in FIG. 7A, thereby defining these parts. Opposite side edges of the piezoelectric ceramic plate having a substantially rectangular shape are inwardly grooved by machining to form the support parts 26 and 27 and the coupling parts 30 and 51, while the dynamic dampers 28 and 29 are formed by cutting the piezoelectric ceramic plate in prescribed lengths with a cutter such as a diamond cutter.

Alternatively, the support parts 26 and 27, the dynamic dampers 28 and 29, the coupling parts 30 and 51 and the holding parts 32 and 33 which are coupled to outer sides of the piezoelectric ceramic plate 23 may be independently formed and pasted to each other by an adhesive or the like to be integrated with each other.

Terminal electrodes 34 and 35 are formed on single major surfaces of the holding parts 32 and 33 respectively. In order to electrically connect the terminal electrodes 34 and 35 with the electrodes 24 and 25, connecting conductive parts 36 and 37 are formed to pass through single major surfaces of the support parts 26 and 27, the dynamic dampers 28 and 29 and the coupling parts 30 and 31 respectively.

In the piezoelectric resonator 21 according to this embodiment, an alternating voltage is applied across the terminal electrodes 34 and 35, to strongly excite vibration in a width expansion mode in the resonance part 22. The nodal points of the vibration in a width expansion mode are present in the center and the central portions of the shorter edges 23a and 25b of the piezoelectric ceramic plate 23. According to this embodiment, the support parts 26 and 27 are coupled to the central portions of the shorter edges 23a and 25b of the piezoelectric ceramic plate 23, whereby vibration energy hardly leaks to the support parts 26 and 27 if the piezoelectric ceramic plate 23 is correctly worked in a target rectangular shape. Thus, resonance energy is reliably trapped between the support parts 26 and 27.

Figure 1A:
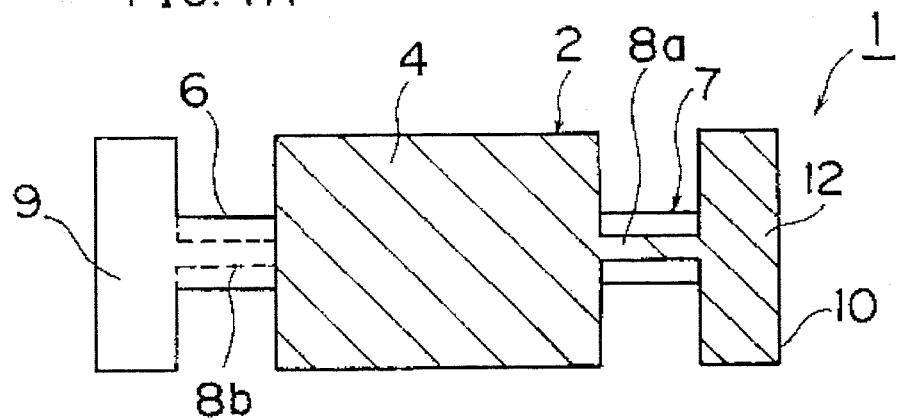
FIGS. 1A and 1B are a plan view and a front elevational view showing a piezoelectric resonator which has given an opportunity for developing the present invention respectively.
Figure 1B:
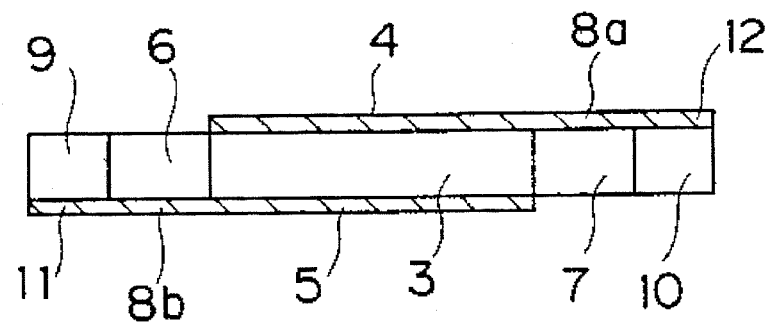
Figure 2:
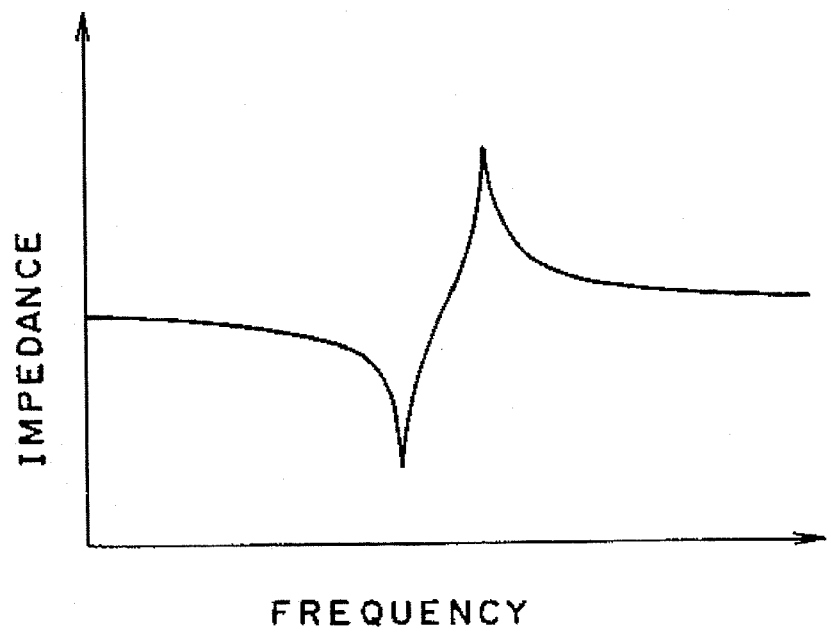
FIG. 2 illustrates theoretical impedance-frequency characteristics attained by the piezoelectric resonator shown in FIGS. 1A and 1B.
Figure 3:
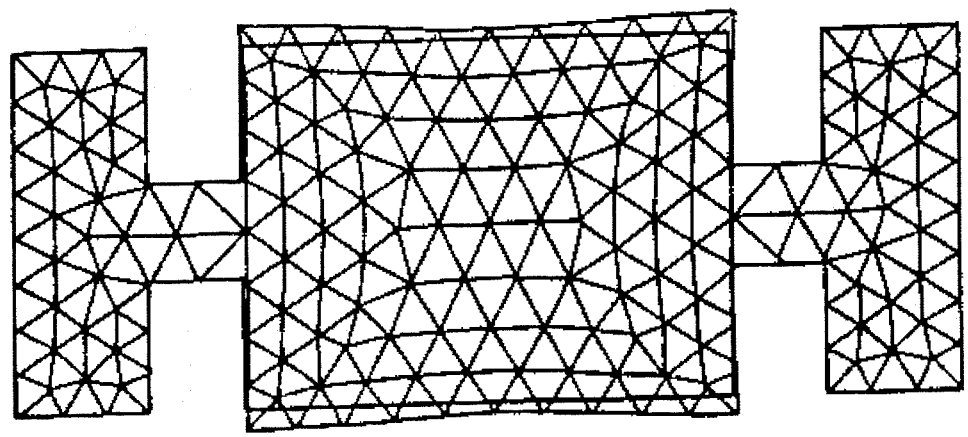
FIG. 3 illustrates a result of finite element analysis of displacement distribution in the piezoelectric resonator shown in FIGS. 1A and 1B.
Figure 4:
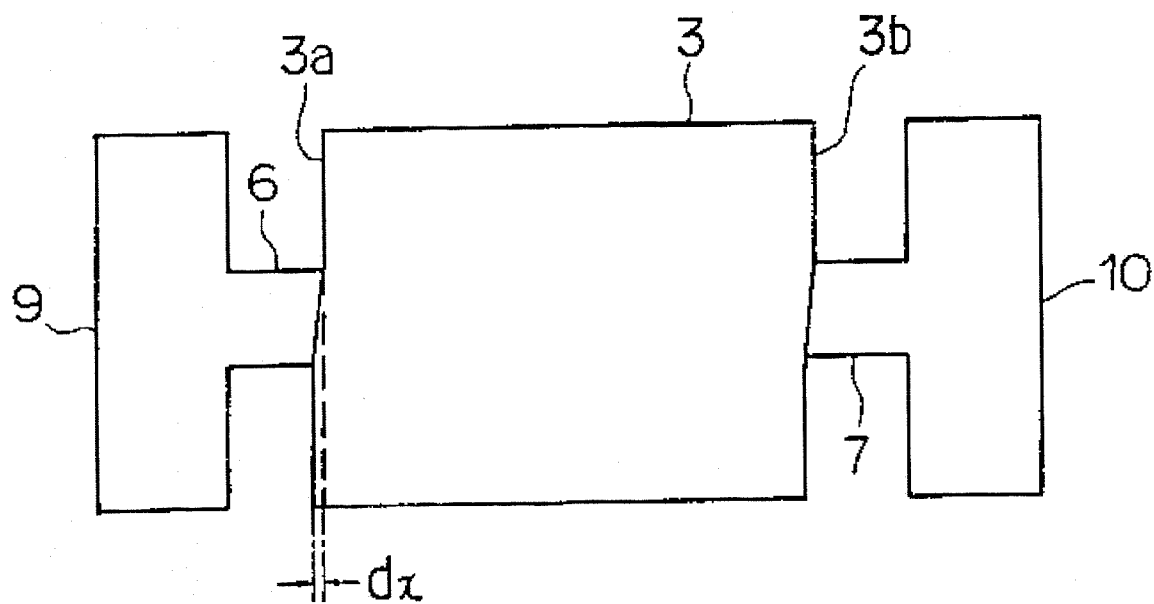
FIG. 4 shows a piezoelectric resonance part deviating from a target shape due to dispersion in working accuracy, in relation to the piezoelectric resonator shown in FIGS. 1A and 1B.
Figure 5:
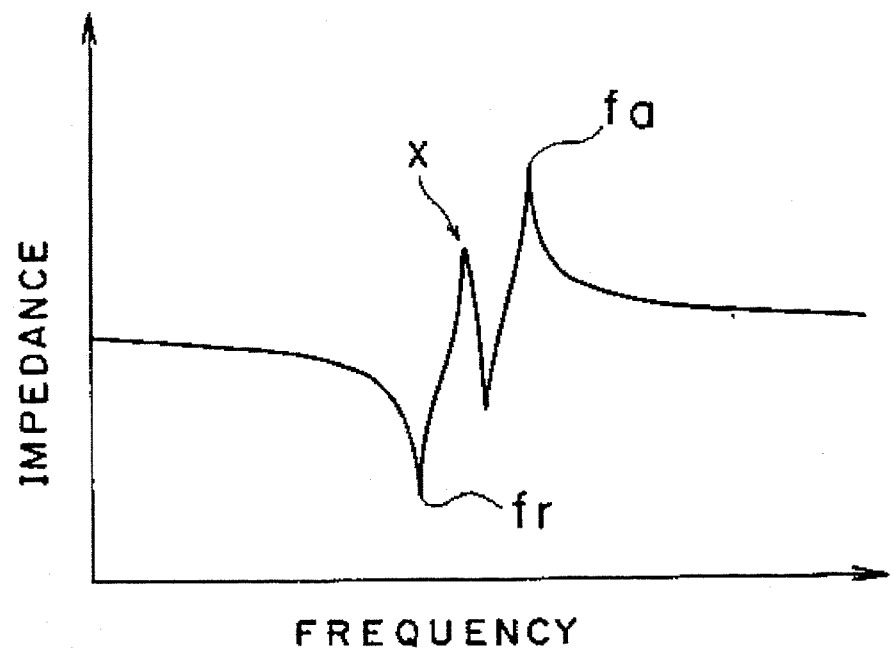
FIG. 5 illustrates impedance-frequency characteristics of the piezoelectric resonator having the shape shown in FIG. 4.
Figure 6:
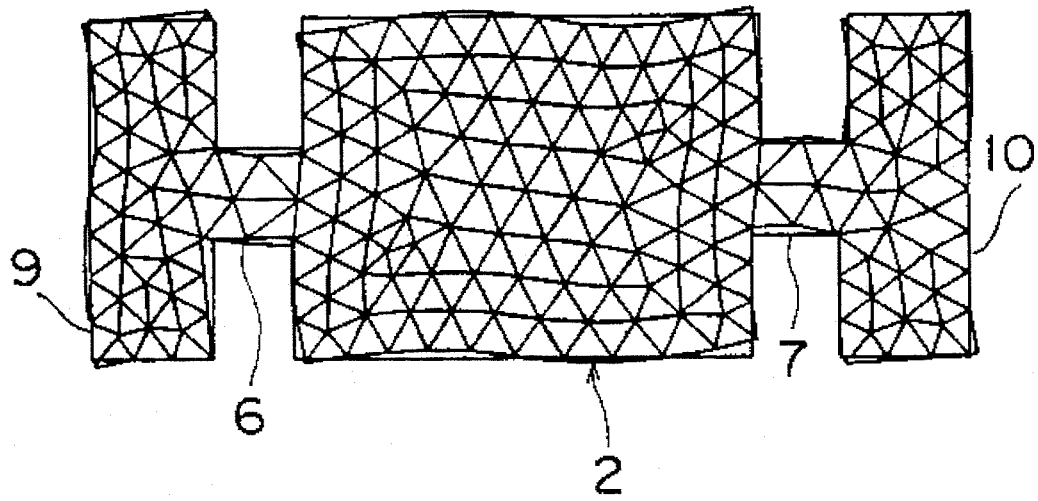
FIG. 6 shows a result of finite element analysis of displacement distribution in the piezoelectric resonator employing a piezoelectric ceramic plate having the shape shown in FIG. 4.

As shown in FIG. 7A, however, grooves for forming the support parts 26 and 27 may deviate from correct positions, leading to deviation of the piezoelectric ceramic plate 23 from the target rectangular shape. In this case, the vibration energy leaks to the support parts 26 and 27, similarly to the piezoelectric resonator shown in FIGS. 1A and 1B.

In the piezoelectric resonator 21 according to this embodiment, however, the dynamic dampers 28 and 29 are formed on the other ends of the support parts 26 and 27, whereby the leaking vibration is effectively suppressed by a phenomenon of a dynamic damper. Therefore, the vibration hardly leaks to the coupling parts 30 and 31 and the holding parts 32 and 33 which are provided outside the dynamic dampers 28 and 29. Thus, it is possible to reliably trap the resonance energy in the portion between the dynamic dampers 28 and 29.

Figure 8:
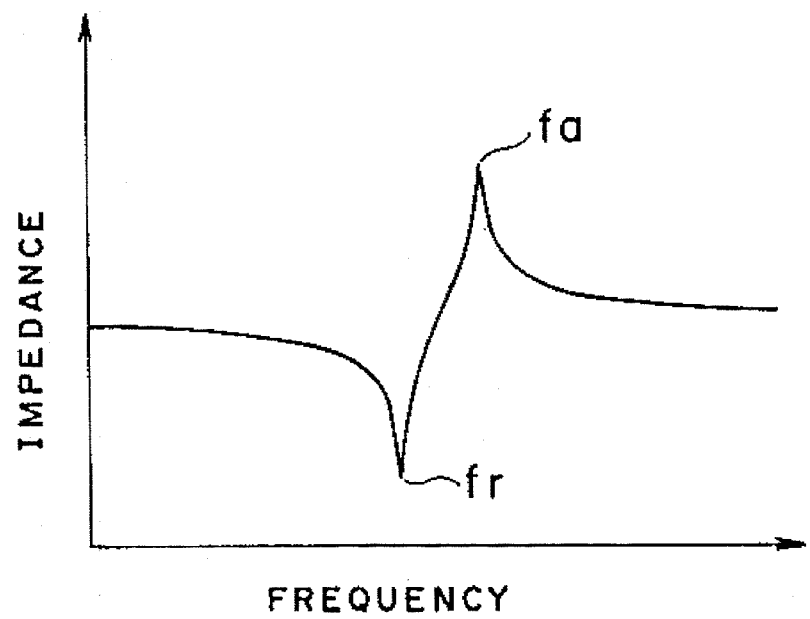
FIG. 8 illustrates impedance-frequency characteristics obtained by theoretically analyzing the piezoelectric resonator according to the first embodiment of the present invention.
Figure 9:
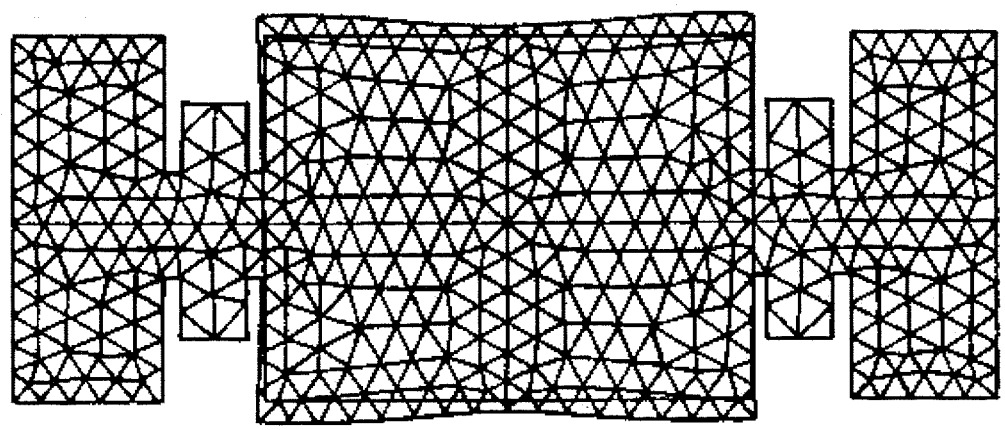
FIG. 9 illustrates displacement distribution in the piezoelectric resonator according to the first embodiment of the present invention analyzed by a finite element method.

FIGS. 8 and 9 illustrate impedance-frequency characteristics and displacement distribution analyzed by a finite element method in the piezoelectric resonator 21 according to this embodiment, in which the shorter edges 25a and 23b of the piezoelectric ceramic plate 23 are worked with deviation of dx=50 μm as shown in FIG. 7A.

It is clearly understood from FIGS. 8 and 9 that resonance energy is reliably trapped in the portion between the dynamic dampers 28 and 29 by actions thereof, to cause no waveform splitting.

FIGS. 8 and 9 illustrate results which are based on simulation by a finite element method. Correctness of such results is now described on the basis of a concrete experimental example.

In order to confirm the effect of the dynamic dampers 28 and 29, lead titanate zirconate ceramics was employed as piezoelectric ceramics to prepare a sample of the piezoelectric resonator 21 which was provided with the piezoelectric ceramic plate 23 having shorter edges of 2.0 mm in length and longer edges of 2.8 mm in length, the support parts 26 and 27 of 0.6 mm in width and 0.8 mm in length and the dynamic dampers 28 and 29 of 0.9 mm in full length and 0.8 mm in width, and impedance-frequency characteristics of this sample were measured. For the purpose of comparison, a comparative sample of the piezoelectric resonator shown in FIGS. 1A and 1B was prepared similarly to the above except that no dynamic dampers 28 and 29 were formed, and subjected to measurement of impedance-frequency characteristics.

Figure 10:
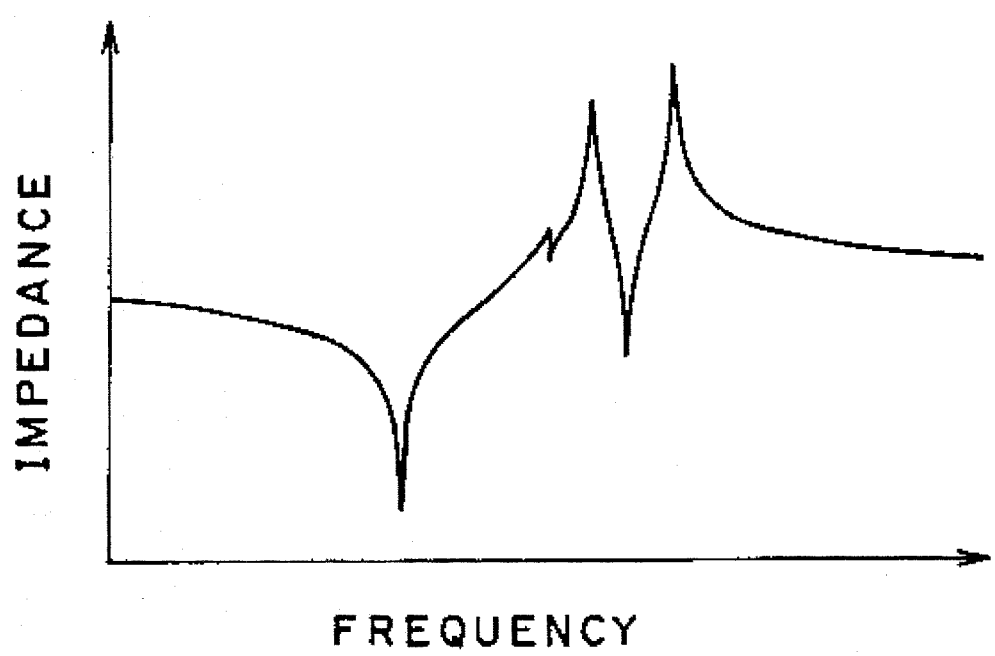
FIG. 10 illustrates impedance-frequency characteristics of the piezoelectric resonator shown in FIGS. 1A and 1B, prepared for the purpose of comparison.
Figure 11:
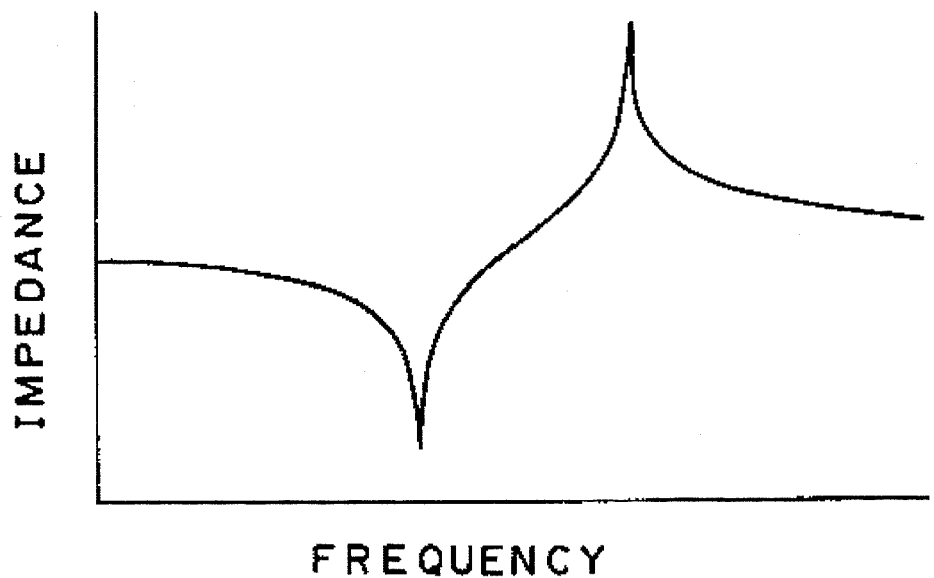
FIG. 11 illustrates impedance-frequency characteristics of a sample of the piezoelectric resonator according to the first embodiment of the present invention.

FIGS. 10 and 11 show the impedance-frequency characteristics of the comparative sample of the piezoelectric resonator having no dynamic dampers and the inventive sample respectively.

As clearly understood from FIGS. 10 and 11, the waveform was frequently split in the comparative sample as shown in FIG. 10 due to dispersion in working accuracy, while the inventive sample exhibited no waveform splitting, as shown in FIG. 11.

Figure 12:
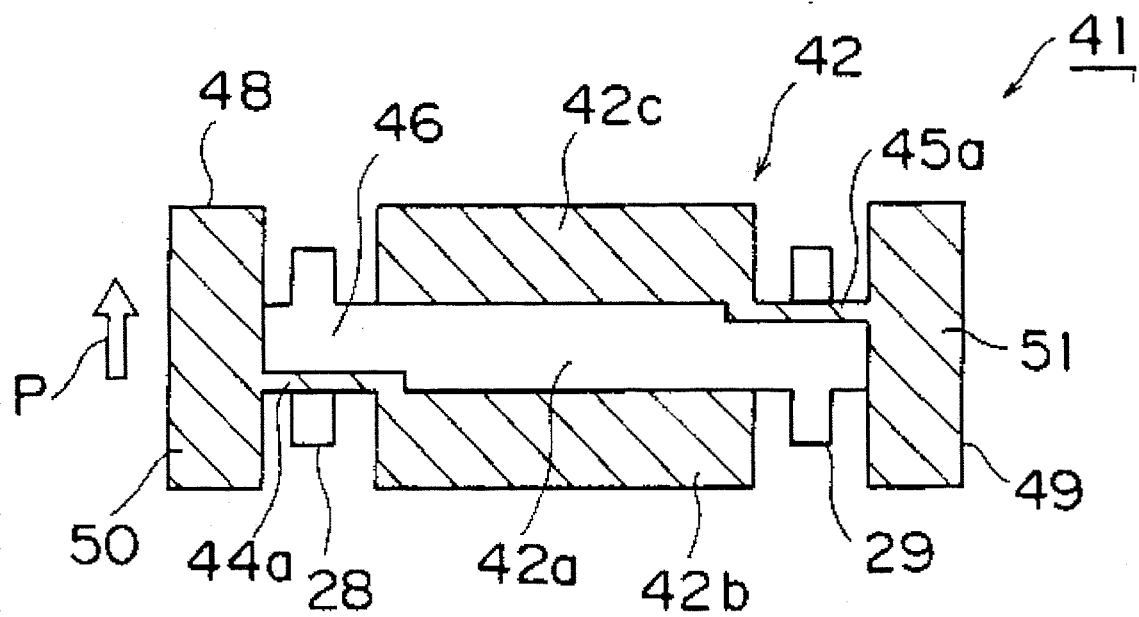
FIG. 12 is a plan view showing a piezoelectric resonator utilizing a width expansion mode according to a second embodiment of the present invention.

FIG. 12 shows an energy-trap piezoelectric resonator 41 according to a second embodiment of the present invention. This piezoelectric resonator 41 has a rectangular plate type piezoelectric resonance part 42 for serving as a vibrator, similarly to the first embodiment. In this piezoelectric resonance part 42, a pair of resonance electrodes 42b and 42c are formed on an upper surface of a piezoelectric plate 42a along longer edges thereof. The piezoelectric plate 42a is polarized along arrow P from the resonance electrode 42b toward the resonance electrode 42c.

When an alternating voltage is applied across the resonance electrodes 42b and 42c, therefore, the piezoelectric resonance part 42 vibrates in a width expansion mode. In this case, the piezoelectric resonance part 42 is displaced in parallel with the electric field as applied, whereby the piezoelectric resonator 41 utilizes a piezoelectric longitudinal effect.

Also in the piezoelectric resonator 41 according to this embodiment, support members 46 and 47 are coupled to nodal points of vibration of the piezoelectric resonance part 42 which resonates in the aforementioned width expansion mode, and holding parts 48 and 49 are coupled to outer ends of the support members 46 and 47 respectively. Referring to FIG. 12, numerals 44a and 45a denote lead conductive parts, and numerals 50 and 51 denote terminal electrodes.

As clearly understood from the embodiment shown in FIG. 12, the inventive resonator utilizing a width expansion mode is applicable not only to that utilizing a piezoelectric transverse effect, but to that utilizing a piezoelectric longitudinal effect.

Figure 13:
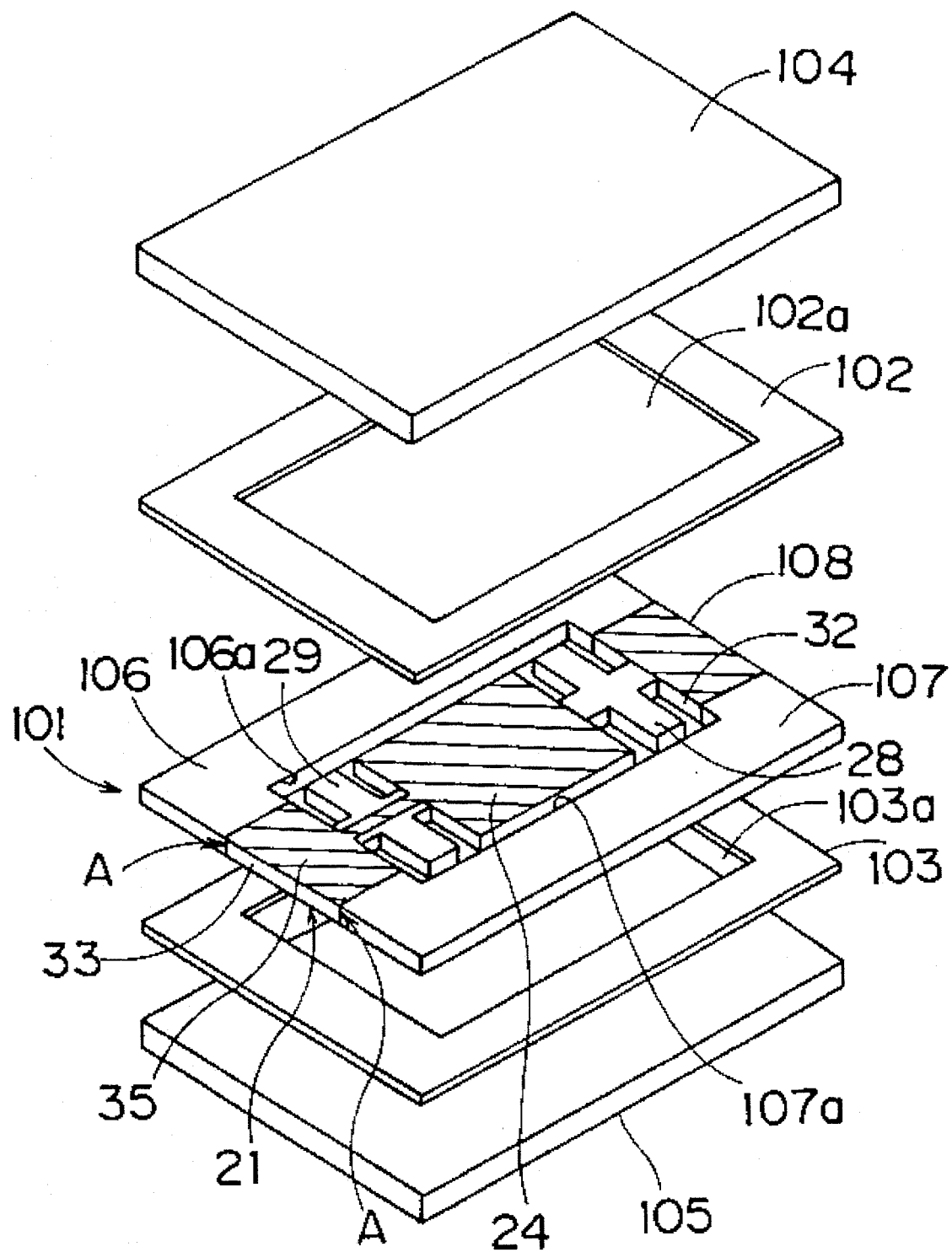
FIG. 13 is an exploded perspective view for illustrating a chip-type piezoelectric resonance component employing the piezoelectric resonator according to the first embodiment of the present invention.

FIG. 13 is an exploded perspective view showing a chip-type piezoelectric resonance component which is formed by the piezoelectric resonator 21 according to the first embodiment shown in FIGS. 7A and 7B.

In this chip-type piezoelectric resonance component, protective substrates 104 and 105 are pasted to upper and lower portions of a resonance plate 101 through rectangular frame type spacers 102 and 103 respectively.

The resonance plate 101 is formed by bonding spacer plates 106 and 107 onto side portions of the aforementioned piezoelectric resonator 21 by an adhesive. The spacer plates 106 and 107 have notches 106a and 107a in inner sides respectively. These notches 106a and 107a are adapted to define spaces for allowing vibration of vibrating parts of the piezoelectric resonator 21, i.e., the resonance part 22 and the dynamic dampers 28 and 29. The spacer plates 106 and 107 are made of insulating ceramics such as alumina or synthetic resin, for example, to be substantially equal in thickness to the piezoelectric resonator 21. In this embodiment, the spacer plates 106 and 107 are bonded to the holding parts 32 and 33 of the piezoelectric resonator 21 by an insulating adhesive. Therefore, the resonance part 22 and the dynamic dampers 28 and 29 of the piezoelectric resonator 21 are stored in an opening in the form of a rectangular frame, which is defined by the spacer plates 106 and 107 and the holding parts 32 and 33. Referring to FIG. 13, numeral 108 denotes a dummy electrode.

The spacers 102 and 103, which are formed by rectangular frame type adhesive films, are adapted to paste the resonance plate 101 and the protective substrates 104 and 105 to each other. These spacers 102 and 103 have openings 102a and 103a respectively. Due to these openings 102a and 103a, spaces for allowing vibration of the vibrating parts of the piezoelectric resonator 21 are defined above and under the piezoelectric resonator 21 respectively.

Alternatively, the spacers 102 and 103 may be omitted and an adhesive may be applied to a lower surface of the protective substrate 104 and an upper surface of the protective substrate 105 in the form of rectangular frames, for defining the aforementioned spaces for allowing vibration.

It is possible to form a chip-type piezoelectric resonance component by stacking the resonance plate 101, the spacers 102 and 103 and the protective substrates 104 and 105 shown in FIG. 13 and forming external electrodes on a pair of side surfaces of the laminate as obtained. The appearance of such a chip-type piezoelectric resonance component is similar to that of a chip-type piezoelectric resonance component shown in FIG. 17 described later.

In the aforementioned chip-type piezoelectric resonance component, the piezoelectric resonator 21 is bonded with the spacer plates 106 and 107 by an insulating adhesive. If defective bonding is caused in bonded portions shown by arrows A in FIG. 13, therefore, sealing performance is damaged. In this case, characteristics such as moisture resistance are reduced in the chip-type piezoelectric resonance component.

Figure 14:
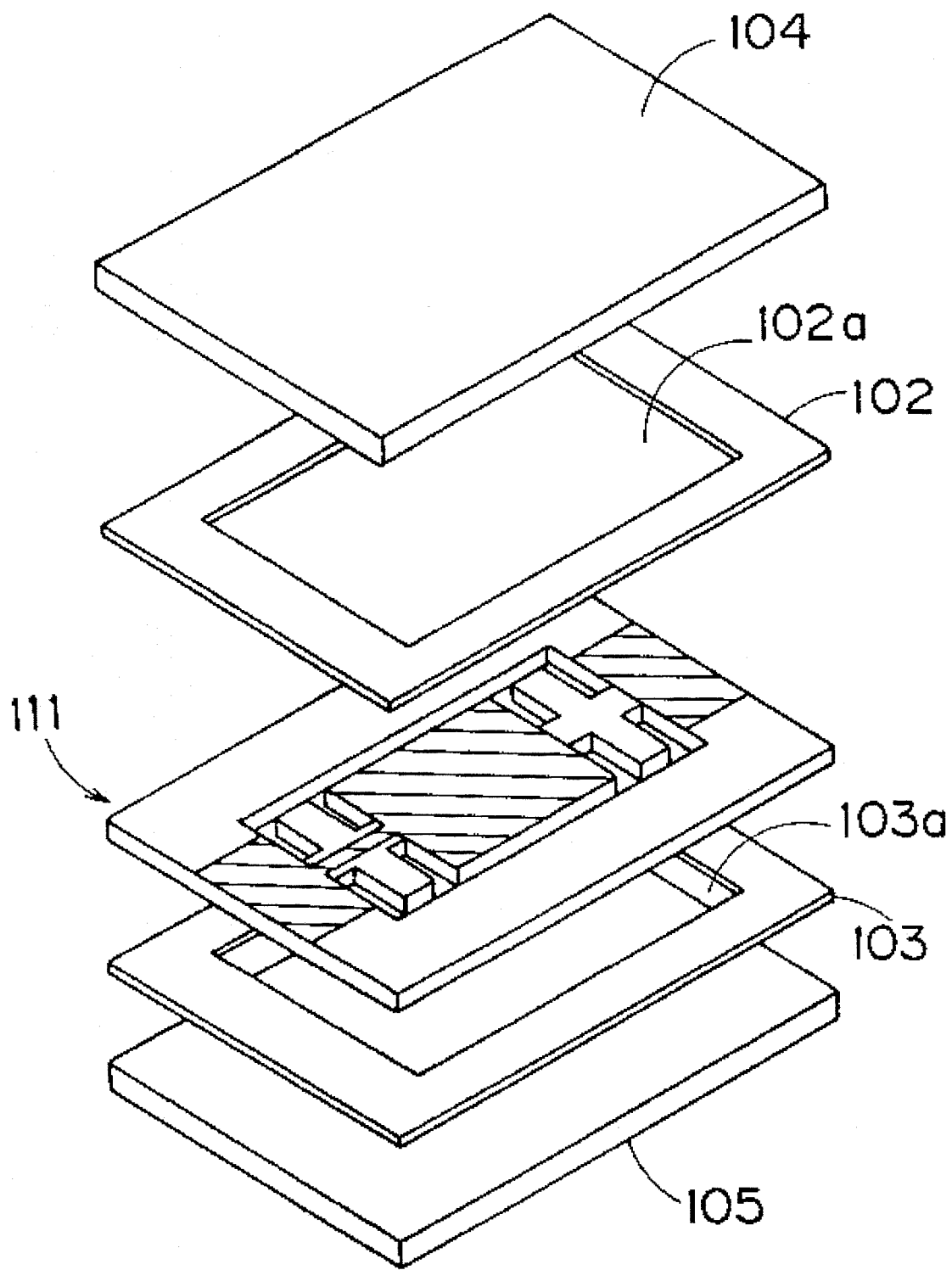
FIG. 14 is an exploded perspective view for illustrating a chip-type piezoelectric resonance component employing a piezoelectric resonator according to a third embodiment of the present invention.

An embodiment which can overcome the aforementioned problem of moisture resistance is now described with reference to FIGS. 14 to 17. FIG. 14 is an exploded perspective view corresponding to FIG. 13, for illustrating a chip-type piezoelectric resonance component according to a third embodiment of the present invention. In the chip-type piezoelectric resonance component shown in FIG. 14, a piezoelectric resonator 111 in the form of a rectangular frame is employed in place of the piezoelectric resonator 21 and the spacers 106 and 107 shown in FIG. 13. Other structures, i.e., spacers 102 and 103 and protective substrates 104 and 105, are similar to those shown in FIG. 13, and hence redundant description is omitted.

Figure 15:
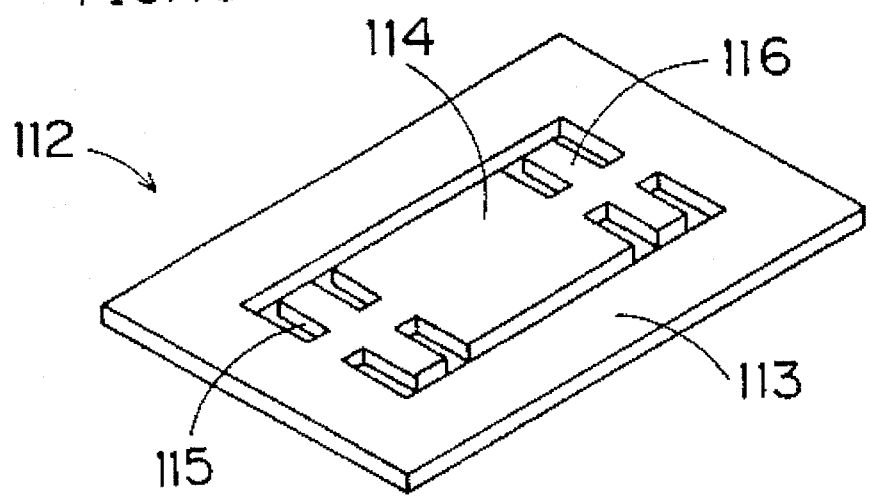
FIG. 15 is a perspective view showing a piezoelectric ceramic employed in the piezoelectric resonator shown in FIG. 14.

The piezoelectric resonator 111 is formed by a single piezoelectric ceramic plate 112 shown in FIG. 15 in a perspective view. This piezoelectric ceramic plate 112 is obtained by working a rectangular piezoelectric ceramic plate into the shape shown in FIG. 15 by etching with s laser beam or machining, for example. In this piezoelectric ceramic plate 112, a rectangular frame type support part 113 having an opening 113a, a piezoelectric ceramic plate part 114 forming a resonance part and piezoelectric ceramic plate parts 115 and 118 forming dynamic dampers are integrated with each other. Electrodes are formed on this piezoelectric ceramic plate 112 similarly to the piezoelectric resonator 21, to obtain the piezoelectric resonator 111 shown in FIG. 16.

In other words, the piezoelectric resonator 111 corresponds to such a structure that the piezoelectric resonator 21 and the spacers 106 and 107 shown in FIG. 13 are integrated with each other. Therefore, the resonance part, the dynamic dampers and the electrodes of the piezoelectric resonator 111 are denoted by the same reference numerals as those of the piezoelectric resonator 21, to omit redundant description.

The piezoelectric resonator 111 shown in FIG. 14 is formed by the aforementioned single piezoelectric ceramic plate 112. While the piezoelectric resonance component shown in FIG. 13 may be deteriorated in moisture resistance through the bonded portions shown by arrows A, the chip-type piezoelectric resonance component according to this embodiment is effectively improved in moisture resistance since no bonded portions are present on side portions of the resonance part and the dynamic dampers.

Figure 17:
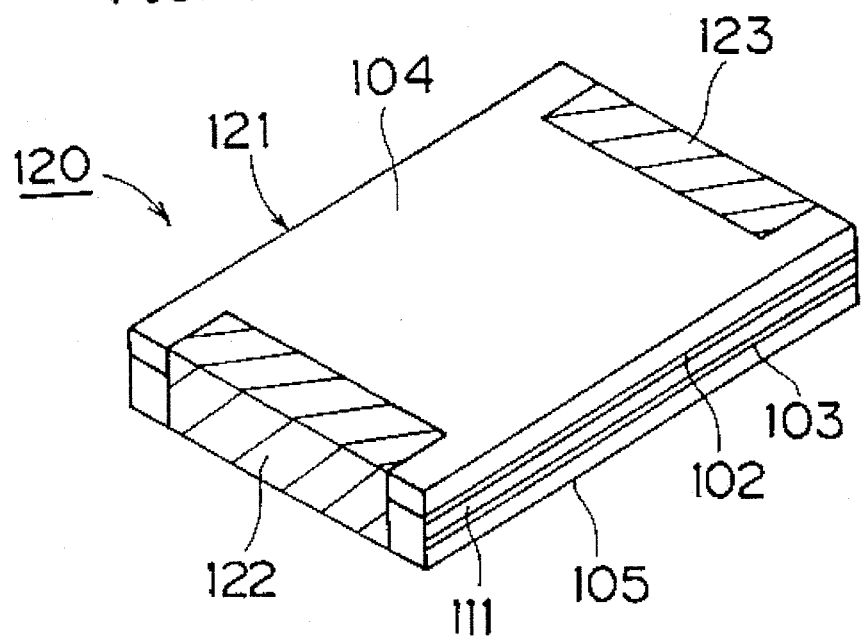
FIG. 17 is a perspective view showing the appearance of the chip-type piezoelectric resonance component shown in FIG. 14.

FIG. 17 is a perspective view showing a chip-type piezoelectric resonance component 120 which is obtained by stacking the piezoelectric resonator 111, the spacers 102 and 103 and the protective substrates 104 and 105 shown in FIG. 14. In this chip-type piezoelectric resonance component 120, external electrodes 122 and 123 are formed to cover a pair of end surfaces of a laminate 121 which is obtained by pasting the aforementioned members to each other. Thus, the chip-type piezoelectric resonance component 120 can be surface-mounted on a printed circuit board or the like, similarly to other chip-type electronic components.

Figure 18:
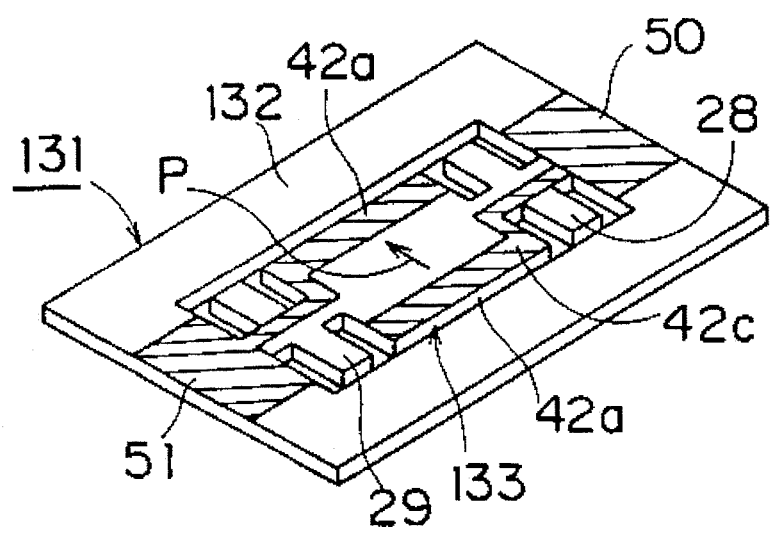
FIG. 18 is a perspective view for illustrating a piezoelectric resonator according to a fourth embodiment of the present invention, which is integrated with a rectangular frame type support member.

FIG. 18 illustrates a modification of the aforementioned piezoelectric resonator 111. Referring to FIG. 18, a piezoelectric resonator 131 has a rectangular frame type support member 132, and a piezoelectric resonator part 133 which is integrally formed with the rectangular frame type support member 132. The piezoelectric resonator part 133 is formed similarly to the piezoelectric resonator 41 shown in FIG. 12. Therefore, parts such as a resonance part which are identical to those of the piezoelectric resonator 41 are denoted by the same reference numerals, to omit redundant description.

Figure 16:
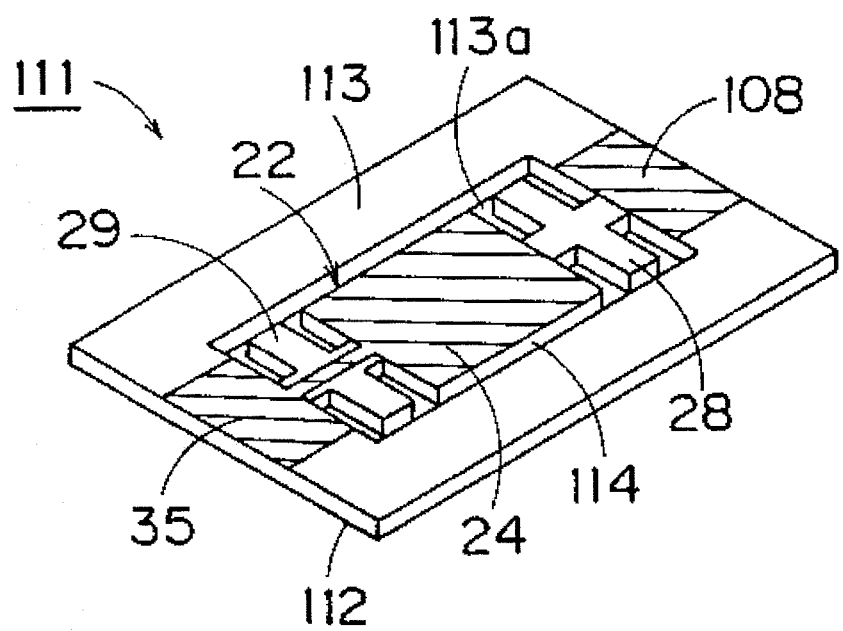
FIG. 16 is a perspective view showing the piezoelectric resonator.

Also in the piezoelectric resonator 131, it is possible to effectively improve moisture resistance of a chip-type piezoelectric resonance component formed by this piezoelectric resonator 131 similarly to the piezoelectric resonator 111 shown in FIG. 16, since the rectangular frame type support member 132 is integrated with the piezoelectric resonator part 133.

Figure 19A:
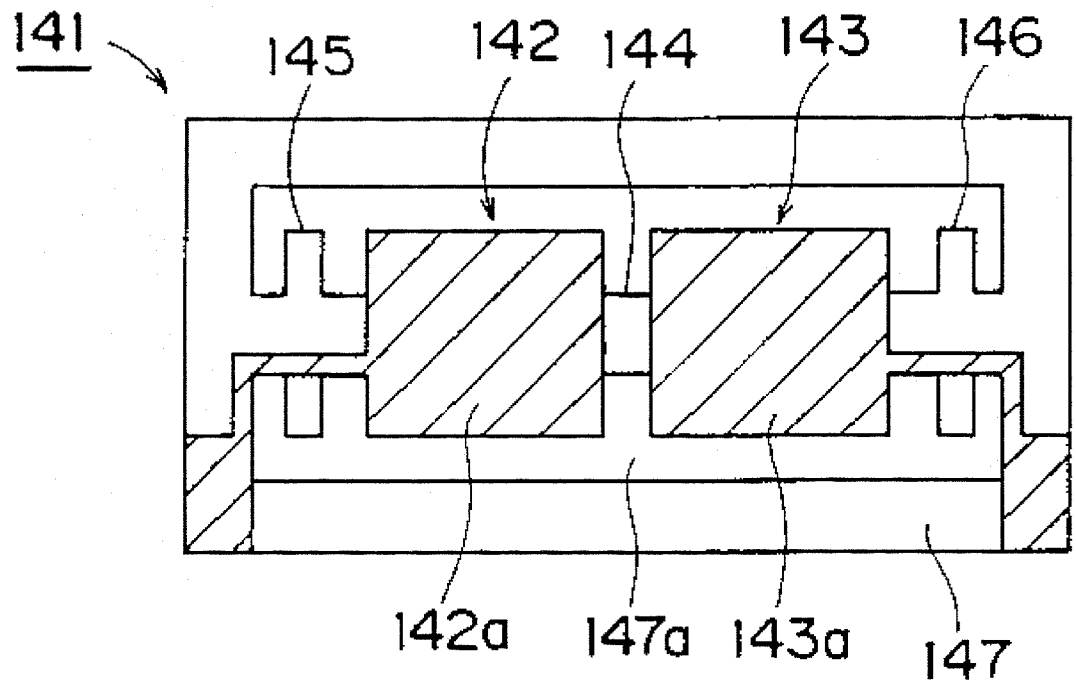
FIGS. 19A and 19B are a plan view showing a piezoelectric filter serving as a piezoelectric resonator according to a fifth embodiment of the present invention and a typical plan view showing shapes of lower electrodes through a piezoelectric ceramic plate respectively.
Figure 19B:
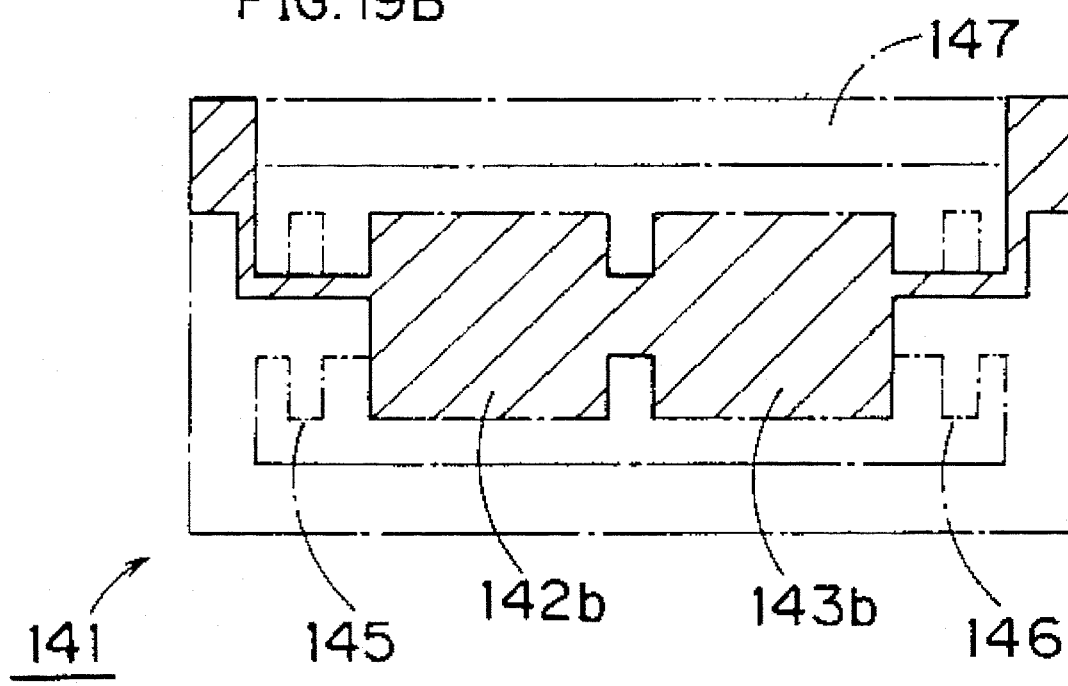

In each of the aforementioned embodiments, a single resonance part utilizing a width expansion mode is formed in the piezoelectric resonator. However, the present invention is also applicable to a piezoelectric resonator which is provided with a plurality of resonance parts utilizing a width expansion mode. FIGS. 19A and 19B are plan view of such a piezoelectric resonator 141 and a typical plan view showing shapes of lower electrodes through a piezoelectric ceramic plate respectively.

The piezoelectric resonator 141, which is adapted to form a double-mode piezoelectric filter, has first and second piezoelectric resonance units 142 and 145 utilizing a width expansion vibration mode. The piezoelectric resonance units 142 and 143 are formed by rectangular piezoelectric ceramic plate parts which are uniformly polarized along thicknesses thereof, electrodes 142a and 143a which are provided on single major surfaces of the rectangular piezoelectric ceramic plate parts for forming resonance electrodes, and electrodes 142b and 143b which are provided on lower surfaces thereof for serving as earth electrodes.

The first and second piezoelectric resonance units 142 and 143 are excited in a width expansion vibration mode respectively, and nodal points of the vibration are coupled with each other by a coupling member 144. In the lower surfaces, on the other hand, the electrodes 142b and 143b are electrically connected with each other by a connecting conductive part which is formed on a lower surface of the coupling member 144. Therefore, it is possible to form a double mode piezoelectric filter utilizing symmetrical and asymmetrical modes by employing the electrode 142a or 143a as an input or output electrode and the lower electrodes 142b and 143b as earth electrodes.

The feature of this embodiment resides in employment of the two piezoelectric resonance units 142 and 143, while other points thereof are similar to those of the piezoelectric resonator 21. Namely, dynamic dampers 145 and 146 which resonate in a bending mode through vibration transmitting parts are formed outside the first and second piezoelectric resonance units 142 and 143 respectively, so that outer ends of these dynamic dampers 145 and 146 are coupled to a rectangular frame type support member 147 through coupling bars. Thus, the first and second piezoelectric resonance units 142 and 143 and the like are arranged in an opening 147a of the rectangular frame type support member 147.

The first and second piezoelectric resonance units 142 and 143 and the like which are arranged in the opening 147a are integrally formed with the support member 147. Namely, a single piezoelectric ceramic plate is machined or etched to obtain an integral member having the plane shape shown in FIGS. 19A and 19B.

Although the piezoelectric ceramic plate is employed as the material for the resonance part in each of the aforementioned embodiments, any material showing the piezoelectric characteristics may be used as that. For example, a piezoelectric single-crystal such as $LiTaO_3$, $LiNbO_3$ or the like or polymer showing the piezoelectric characteristics may be used.

Further, the resonance part or resonator may be constituted by composite material wherein a piezoelectric layer is formed on a metal plate or semiconductor plate not showing piezoelectric characteristics.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A resonator comprising:
   a resonance part including a substantially rectangular plate vibrating in a width expansion mode such that nodal points of vibration are defined at respective centers of major surfaces and central portions of shorter side surfaces of the substantially rectangular plate;
   a support part having first and second ends, the first end being coupled to one of the shorter side surfaces of the resonance part at a location proximate to a nodal point of the resonance part so as to receive vibration from the resonance part; and
   a dynamic damper coupled to the second end of the support part, the dynamic damper having a natural resonance frequency that is substantially equal to a frequency of the vibration received by the support part from the resonance part.

2. A resonator in accordance with claim 1, wherein the substantially rectangular piezoelectric plate is made of at least one of piezoelectric ceramics and piezoelectric crystal.

3. A resonator in accordance with claim 1, further comprising a coupling part having a first end coupled to a first side of the dynamic damper that is opposite to a second side coupled with the support part, and a holding part coupled to a second end of said coupling part.

4. A resonator in accordance with claim 3, wherein the resonance part, the support part, the dynamic damper, the coupling part and the holding part are formed by a single unitary member.

5. A resonator in accordance with claim 3, wherein the resonance part, the support part, the dynamic damper, the coupling part and the holding part are formed by separate members, the resonance part, the support part, the dynamic damper, the coupling part and the holding part being bonded to be integrated with each other.

6. A resonator in accordance with claim 1, further comprising at least two electrodes located on the resonance part.

7. A resonator in accordance with claim 6, wherein at least one of each of the support part, the dynamic damper, the coupling part and the holding part is provided on first and second sides of the resonance part, respectively.

8. A resonator in accordance with claim 7, further comprising terminal electrodes located on at least one major surface of each holding part.

9. A resonator in accordance with claim 8, wherein the terminal electrodes on the holding parts are electrically connected with at least two electrodes located on the piezoelectric plate.

10. A resonator in accordance with claim 6, wherein said resonance part comprises a piezoelectric resonance part including a portion of the piezoelectric plate, the piezoelectric plate being polarized along a thickness direction thereof, and at least two electrodes located on both major surfaces of the piezoelectric plate.

11. A resonator in accordance with claim 6, wherein said resonance part comprises a portion of the piezoelectric plate being polarized in a direction perpendicular to its thickness, and first and second electrodes arranged on one major surface of the piezoelectric plate at a prescribed distance from each other.

12. A resonator in accordance with claim 11, wherein at least one of each of the support part and the dynamic damper are provided on each side of the resonance part,
   the resonator further comprising a coupling part provided for each of the dynamic dampers, the coupling part having an end connected to a first side of each of the dynamic dampers, the first side of each of the dynamic dampers being opposite to a second side of each of the dynamic dampers that is coupled with the support part, and a holding part coupled to another end of the coupling part.

13. A resonator in accordance with claim 12, further comprising first and second terminal electrodes located on at least one major surface of each of the holding parts, the first and second terminal electrodes being electrically connected to the first and second electrodes, respectively.

14. A resonator in accordance with claim 7, further comprising first and second spacer plates arranged on side portions of the holding parts and bonded to the holding parts for defining a rectangular storage space enclosing the resonance the and the dynamic dampers.

15. A resonator in accordance with claim 14, wherein the first and second spacer plates and the holding parts are formed by a single unitary member, whereby the resonance part vibrating in the width expansion mode and the dynamic dampers are arranged in an opening of a rectangular frame support member.

16. A piezoelectric resonator in accordance with claim 14, wherein the resonator comprises a chip-type piezoelectric resonance component, further comprising first and second protective substrates stacked on upper and lower portions of an integrated structure of the piezoelectric resonator and the spacer plates, and
   vibration space forming means for defining spaces for allowing vibration of the resonance part and the dynamic dampers of the piezoelectric resonator above and under the resonance part and the dynamic dampers, respectively.

17. A piezoelectric resonator in accordance with claim 16, wherein the vibration space forming means comprise substantially rectangular frame spacers.

18. A resonator in accordance with claim 15, wherein the resonator comprises a chip-type piezoelectric resonance component, further comprising first and second protective substrates stacked on upper and lower portions of an integrated structure of the piezoelectric resonator and the spacer plates, and
   vibration space forming means for defining spaces for allowing vibration of the resonance part and the dynamic dampers of the piezoelectric resonator above and under the resonance part and the dynamic dampers, respectively.

19. A piezoelectric resonator in accordance with claim 18, wherein the vibration space forming means comprise substantially rectangular frame spacers.

* * * * *